United States Patent [19]
Guglhör

[11] Patent Number: 4,758,187
[45] Date of Patent: Jul. 19, 1988

[54] CONTACT PIN FOR AN ELECTRICAL CIRCUIT BOARD

[76] Inventor: Bernhard Guglhör, Kulturenweg 11, 8959 Buching, Fed. Rep. of Germany

[21] Appl. No.: 61,184

[22] Filed: Jun. 11, 1987

Related U.S. Application Data

[63] Continuation of Ser. No. 817,914, Jan. 10, 1986, abandoned.

[30] Foreign Application Priority Data

Jan. 11, 1985 [DE] Fed. Rep. of Germany ....... 3500796
Jan. 18, 1985 [EP] European Pat. Off. ......... 85100511.6

[51] Int. Cl.$^4$ ..................... H01R 13/41; H01R 4/10
[52] U.S. Cl. ........................................ 439/741; 439/84
[58] Field of Search ................ 439/81, 82, 84, 741, 439/751, 870, 873, 733, 869

[56] References Cited

U.S. PATENT DOCUMENTS 4,274,699  6/1981  Keim ................................ 439/637
4,586,778  5/1986  Walter et al. ................... 439/825

FOREIGN PATENT DOCUMENTS 3210348  8/1983  Fed. Rep. of Germany ...... 439/751

*Primary Examiner*—Gil Weidenfeld
*Assistant Examiner*—Gary F. Paumen
*Attorney, Agent, or Firm*—Price, Heneveld, Cooper, DeWitt & Litton

[57] ABSTRACT

A contact pin for an electrical component, in particular a circuit board, which is provided with a central web-like upset-zone is also provided with spherically molded enlargements on both sides of the press fit portion in order to stabilize the deformation process when the contact pin is being pressed in. The portion of the contact pin located between the connector and the printed circuit board is further formed by two laterally spaced narrow webs as a parallelogram guide means.

4 Claims, 1 Drawing Sheet

CONTACT PIN FOR AN ELECTRICAL CIRCUIT BOARD

This is a continuation of application Ser. No. 817,914, filed Jan. 10, 1986, abandoned.

The present invention relates to a contact pin for an electrical circuit board, which sits in its mounted state in an opening in a connector plate and with a press fit in an opening in a printed circuit board, the press fit portion of the pin sitting in the printed circuit board with at least two peripheral portions in the opening of the printed circuit board, and the contact pin being provided in the press fit portion with a central web-like upset-zone which interconnects the two oppositely arranged outer portions and in which plastical deformation takes place during the pressing-in process.

Contact pins are used in considerable quantities for the production of electronic components, in particular for circuit boards, in the openings of which the contact pins are inserted.

In order to guarantee a firm fit of the contact pins in the corresponding openings in the printed circuit board, it is known to anchor the contact pins with a press fit in the openings of the circuit board. For this purpose, the contact pins have a press fit portion produced by a stamping process, by means of which they are anchored with a press fit in the corresponding opening in the circuit board. A known contact pin with this construction (U.S. Pat. No. 4,274,699) includes a central web-like upset-zone which interconnects two outer portions which are for abutting the edge of the opening of the circuit board. When the contact pin is pressed in, plastic deformation is to be essentially effected in the area of the upset-zone.

For this purpose, the central web has a relatively narrow design. During the deformation due to the pin being pressed into the corresponding opening in the circuit board, the web folds or buckles laterally, involving not a predominantly plastic deformation, however, but a deformation having an essentially elastic portion and thus the build-up of correspondingly large elastic restoring forces. This lateral folding or buckling of the web allows the pin to spring back into its initial position, at least to a certain extent, in case it is removed from the opening in the circuit board again. In the extreme case, the contact pin can, if loaded accordingly, move beyond the shearing limit in the web area, thereby forming two separate arms in the press fit portions which in turn cause the contact pin to be held within the opening in the circuit board by elastic restoring forces. The disadvantage of the known contact pin must thus be considered to be that no definite plastic deformation can take place, but rather an essential portion of elastic restoring forces is present after the pressing-in process and no reliable statements can be made concerning the strength of the press fit due to the lateral buckling or deflection of the web during the pressing-in process.

Due to production errors, in particular tolerance deviations, the connector plate may not be exactly aligned with the printed circuit board. Even a slightly lateral deviation, for example, between the connector plate and the printed circuit board located therebelow forces all contact pins to be on a slant. This also affects the fit of the contact pins in the circuit board since the slanted position may cause damage to the walls of the openings in the printed circuit board and the connector plate which openings are usually coated. If the contact pin deviates from its normal vertical position in its uppermost area on such a slant, this means that the tool (die) for pressing in the contact pin can no longer be directed exactly past the contact pin. All in all, the electrical contact may be impaired by the misalignment of the contact pin.

The invention is based on the problem of providing a contact pin which allows for controlled upsetting without lateral buckling during the pressing-in process and thus for stabilized upsetting.

The invention is further based on the problem of preventing the contact pin, in particular the portions of the contact pin protruding at the top out of the connector plate and protruding at the bottom out of the printed circuit board, from being on a slant due to inexact alignment of the printed circuit board and the connector plate, but also due to thermal extension.

According to the invention, the web is provided with lateral enlargements which rule out that the material deviates or displaces laterally within the upset-zone with the contact pin is being pressed in and during the resulting plastical deformation. Instead, the deformation is confined to the central zone of the contact pin, i.e. into the upset-zone, by displacing the material radially into the center of the contact pin, i.e. into the upset-zone. The outer portions are not deformed but are instead displaced along an axis radial to the longitudinal axis of the contact pin, thus not being subject to any deformation or bending. There is thus essentially a reduction in the radial dimension of the contact pin in the press fit portion perpendicular to the actual longitudinal axis of the contact pin. The material collects essentially within the web area which is compressed into a member of generally spherical cross-sectional shape.

According to the invention, there is thus a controlled and stabilized plastic deformation of the web, whereby the contact pin sits firmly and rigidly within the corresponding opening in the printed circuit board due to this deformation following the pressing-in process. Due to the plastic deformation of material in the upset-zone, tolerance differences may be readily compensated. The upset-zone rules out any considerable recession of the abutting portions of the press fit portion as is the case with contact pins having a larger portion of elastic deformation.

In the following, embodiments of the invention shall be described with reference to the drawing. It shows:

FIG. 1 a cross-section of the pressing-in zone of a contact pin before the pressing-in process, FIG. 2 a cross-section of the pressing-in zone of the contact pin shown in FIG. 1, following the pressing-in process, and FIG. 3 a perspective view of the pressing-in zone of a contact pin;

Figure 1:
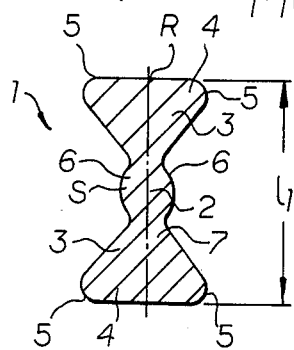
Figure 2:
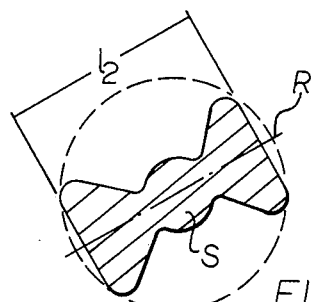

FIGS. 1 and 2 show the cross-section of a press fit portion of a contact pin for a circuit board, with which the contact pin is mounted with a press fit in an opening having the circular cross-section indicated by dotted lies in FIG. 2 in a printed circuit board which is not shown. As the cross-sectional view shows, the press fit portion referred to in general as 1 has a web 2 which constitutes a predetermined upset-zone S, disposed in the center and extends along the axis of the contact pin essentially over the axial length of press fit portion 1 or the compression zone. Upset-zone S formed by central web 2 extends between the widened portions 3 which have a trumpet-shaped cross-section forming the outer portions 4 arranged opposite each other radially with respect to the axis of the pin. The outer portions serves the purpose of abutting the edge of the opening of the printed circuit board after the pressing-in process. The outer edges 5 of outer portions 4 are preferably rounded to protect the wall of the opening in the printed circuit board. By means of the rounded outer edges 5 the outer portions are brought in pressing contact with the edges of the opening in the printed circuit board when the contact pin is pressed into the printed circuit board, as indicated in FIG. 2. Outer portions 4 are formed in an essentially rectangular cross-sectional form, which is based on the fact that the press fit portion or the pressing-in zone of the contact pin is molded out of a contact pin with a rectangular, in particular square, cross-section by stamping using two oppositely arranged dies, which are moved toward each other during the stamping process. The width of the die corresponds essentially to the radial dimension of the web of the upset-zone.

As FIG. 1 shows, web 2 of upset-zone S is provided on both sides with generally semi-circular molded enlargements 6, which are more or less of circle-segment shape in the embodiment shown. Enlargements 6 are symmetrical to the radial axis R running through the axis of the pin. In accordance with the view in FIG. 1 the enlargements extend essentially across the entire width of web 2 and run directly via a curve 7 into the trumpet-shaped widened portions 3 of the contact pin.

The view according to FIG. 2 shows that when the pressing-in process is over the plastic deformation of the material has taken place exclusively in the area of upset-zone S, which has become correspondingly thicker. In the embodiment shown, upset-zone S has been deformed more or less spherically. The two outer portions 4, which were essentially spared from deformation, have moved toward each other in the direction of radial axis R, which was effected by a corresponding reduction of the width and a corresponding thickening of upset-zone S. The radial length, i.e. the length perpendicular to the axis of the contact pin, has been reduced from length $l_1$ of FIG. 1 to length $l_2$ as in FIG. 2.

Figure 3:
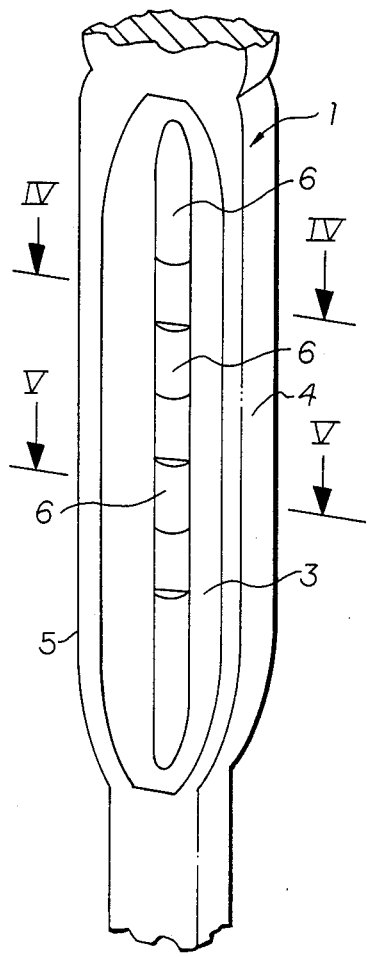
Figure 4:
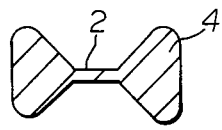
FIG. 4 is a sectional view taken along the plane IV—IV of FIG. 3.
Figure 5:
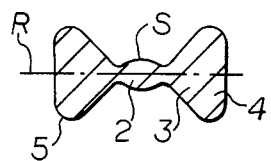
FIG. 5 is a sectional view taken along the plane V—V of FIG. 3.

In the embodiment according to FIG. 3, the two enlargements 6 do not extend along the entire length of press fit portion 1 but are provided in certain areas or sections along the length of the press fit portion. Between the various enlargements 6, which are in turn formed symmetrically to radial axis R, there are portions free from enlargements, as indicated in the cross-section of FIG. 4. These portions have a uniform web thickness. The web is molded in a straight line, as can also be seen in FIG. 4. The web thickness corresponds approximately to the smallest thickness of enlargements 6. In the embodiment according to FIG. 3, upset-zone S runs into conical widened portions 3 to outer portions 4 not via curves but at an acute angle. In accordance with the embodiment shown, four enlargements 6 are provided on each side of the contact pin, whereby the two outer enlargements taper toward the end of the press fit portion and are also formed so as to be longer than the two enlargements located on the inside.

I claim:

1. A connector pin of electrically conductive material for insertion in an opening through a circuit board, said pin having a contact portion adapted to seat in said opening with a press fit, electrically conductive, engagement with the walls of said opening, said contact portion in cross section having a pair of enlarged ends and a connecting portion joined to each of said ends by a pair of necked down portions; said ends, necked down portions, and said connecting portion all being aligned along and symmetrical about a common axis normal to the longitudinal central axis of said pin, said common axis extending through both said ends; the connecting portion being uniformly radially enlarged with respect to said necked down portions in a direction normal to and symmetrical about said common axis whereby compressive pressure exerted on said pin in the lengthwise direction thereof to push it into said circuit board opening will cause the thickness of said connecting portion normal to said common axis to increase without displacement of any of said end portions, connecting portion and necked down portions from their symmetrical alignment with said common axis to thereby compensate for the resulting contraction along said common axis and effect deformation of said connecting portion beyond the elastic limit of the material of said pin and provide continuing positive contact pressure against the walls of the opening after release of the compressive pressure.

2. A connector pin of electrically conductive material for insertion in an opening through a circuit board, said pin having a contact portion adapted to seat in said opening with a press fit electrically conductive engagement with the walls of said opening, said contact portion having a bow-tie shape with a pair of enlarged ends and a connecting portion joined to each of said ends by a pair of necked down portions; said ends, necked down portions and said connecting portion all being aligned along and symmetrical about a common axis normal to the longitudinal central axis of said pin and extending through both of said ends; the connecting portion being uniformly radially enlarged with respect to said necked down portions in a direction normal to and symmetrical about said common axis whereby insertion pressure exerted on said pin in the lengthwise direction thereof to push it into said circuit board opening will cause the radial thickness of said connecting portion transverse to said common axis to increase without displacement of any of said end portions, connecting portion and necked down portions from their symmetrical alignment with said common axis to thereby compensate for the resulting contraction along said common axis which effects deformation of said connecting portion beyond the elastic limit of the material of said pin and provide continuing positive contact pressure against the walls of the opening to effect an electrically conductive connection therewith continuing after release of the insertion pressure.

3. A connector pin as described in claim 2 wherein portions of said ends contacting the walls of the opening are arranged in a circle.

4. A connector pin as described in claim 2 wherein said connecting portion is of generally ellipsoidal oblate shape.

* * * * *

UNITED STATES PATENT AND TRADEMARK OFFICE
CERTIFICATE OF CORRECTION

PATENT NO. : 4,758,187

DATED : July 19, 1988

INVENTOR(S) : Bernhard Guglhor

It is certified that error appears in the above-identified patent and that said Letters Patent is hereby corrected as shown below:

Column 1, line 39:
    "laterially" should be --laterally--
Column 1, line 61:
    "slightly" should be --slight--
Column 2, line 21:
    "with" should be --when--
Column 3, line 5:
    "serves" should be --serve--
Column 3, line 10:
    After "By means of", cancel "the"
Column 4, line 25:
    "effect" should be --which effects--
Column 4, line 61:
    "in" should be --to lie on--

Signed and Sealed this

Twenty-eighth Day of March, 1989

Attest:

DONALD J. QUIGG

Attesting Officer      Commissioner of Patents and Trademarks